(12) United States Patent
Corneille et al.

(10) Patent No.: US 7,963,802 B2
(45) Date of Patent: Jun. 21, 2011

(54) EXTERNAL ELECTRICAL CONNECTORS FOR SOLAR MODULES

(75) Inventors: Jason Corneille, San Jose, CA (US); Michael Meyers, San Jose, CA (US)

(73) Assignee: Miasole, Santa Clara, CA (US)

( * ) Notice: Subject to any disclaimer, the term of this patent is extended or adjusted under 35 U.S.C. 154(b) by 0 days.

(21) Appl. No.: 12/684,278

(22) Filed: Jan. 8, 2010

(65) Prior Publication Data

US 2010/0326498 A1    Dec. 30, 2010

Related U.S. Application Data

(60) Provisional application No. 61/222,012, filed on Jun. 30, 2009, provisional application No. 61/238,164, filed on Aug. 30, 2009.

(51) Int. Cl.
*H01R 33/00* (2006.01)

(52) U.S. Cl. .................. 439/627; 136/244; 439/855

(58) Field of Classification Search .............. 439/627, 439/502, 521, 522, 754, 855; 174/138 F; 136/244
See application file for complete search history.

(56) References Cited

U.S. PATENT DOCUMENTS

| | | | | |
|---|---|---|---|---|
| 1,014,718 A * | 1/1912 | Parsons | .......... | 439/502 |
| 3,260,835 A * | 7/1966 | Soukey et al. | .......... | 219/213 |
| 3,575,721 A * | 4/1971 | Mann | .......... | 136/244 |
| 4,089,576 A * | 5/1978 | Barchet | .......... | 439/507 |
| 4,310,211 A * | 1/1982 | Bunnell et al. | .......... | 439/358 |
| 4,460,232 A * | 7/1984 | Sotolongo | .......... | 439/535 |
| 6,039,616 A | 3/2000 | Pereira et al. | | |
| 6,249,966 B1 | 6/2001 | Pereira et al. | | |
| 6,337,436 B1 * | 1/2002 | Ganz | .......... | 136/251 |
| 6,475,043 B2 | 11/2002 | Pereira et al. | | |
| 6,520,812 B1 | 2/2003 | Machado | | |
| 6,599,156 B2 | 7/2003 | Pereira et al. | | |
| 6,599,157 B2 | 7/2003 | Pereira et al. | | |
| 6,607,409 B2 | 8/2003 | Machado | | |
| 6,649,822 B2 * | 11/2003 | Eguchi et al. | .......... | 136/251 |
| 6,676,455 B2 * | 1/2004 | Machado | .......... | 439/855 |
| 6,780,071 B2 | 8/2004 | Pereira et al. | | |
| 6,790,104 B2 | 9/2004 | Antaya et al. | | |
| 6,945,831 B2 | 9/2005 | Pereira et al. | | |

(Continued)

FOREIGN PATENT DOCUMENTS

JP    2002/359389    12/2002

(Continued)

OTHER PUBLICATIONS

International Search Report and Written Opinion mailed Jan. 21, 2011, for Application No. PCT/US2010/040426.

*Primary Examiner* — Neil Abrams
*Assistant Examiner* — Phuong T Nguyen
(74) *Attorney, Agent, or Firm* — Weaver Austin Villeneuve & Sampson LLP

(57) ABSTRACT

Provided are low profile, water-resistant and touch safe safe electrical connectors for solar modules. According to various embodiments, the electrical connectors include a low-profile conductive stud, a low-profile sheath that surrounds the stud, and a socket to mate with the stud. According to various embodiments, the sheath and socket mate via keyed inter-engageable features. Also according to certain embodiments, the socket is fastened to the stud and/or sheath via snap fastening.

21 Claims, 15 Drawing Sheets

U.S. PATENT DOCUMENTS

| | | |
|---|---|---|
| 7,083,481 B2 | 8/2006 | Pereira et al. |
| 7,182,625 B2 | 2/2007 | Machado et al. |
| 7,226,299 B2 | 6/2007 | Pereira et al. |
| 7,255,589 B2 | 8/2007 | Machado et al. |
| 7,296,347 B2 | 11/2007 | Antaya et al. |
| 7,371,083 B2 | 5/2008 | Pereira et al. |
| 7,438,610 B2 | 10/2008 | Machado et al. |
| 7,530,843 B1 * | 5/2009 | Tesfay et al. ............. 439/587 |
| 7,553,204 B2 | 6/2009 | Pereira et al. |
| 7,662,001 B2 | 2/2010 | Machado et al. |
| 7,700,878 B2 | 4/2010 | Antaya et al. |
| 2002/0004325 A1 | 1/2002 | Pereira et al. |
| 2002/0187690 A1 | 12/2002 | Pereira et al. |
| 2003/0013352 A1 | 1/2003 | Machado |
| 2003/0017756 A1 | 1/2003 | Pereira et al. |
| 2003/0203666 A1 | 10/2003 | Pereira et al. |
| 2004/0018782 A1 | 1/2004 | Antaya et al. |
| 2004/0237302 A1 | 12/2004 | Antaya et al. |
| 2004/0248477 A1 | 12/2004 | Pereira et al. |
| 2005/0239348 A1 | 10/2005 | Pereira et al. |
| 2006/0121771 A1 | 6/2006 | Machado et al. |
| 2007/0287322 A1 | 12/2007 | Machado et al. |
| 2008/0214064 A1 | 9/2008 | Pereira et al. |
| 2009/0149069 A1 | 6/2009 | Carcangiu et al. |
| 2010/0068924 A1 * | 3/2010 | Nightingale et al. ......... 439/544 |
| 2010/0154859 A1 | 6/2010 | Antaya et al. |

FOREIGN PATENT DOCUMENTS

| | | |
|---|---|---|
| JP | 2005/057274 | 3/2005 |

* cited by examiner though the invention will be described in conjunction with these

EXTERNAL ELECTRICAL CONNECTORS FOR SOLAR MODULES

CROSS-REFERENCE TO RELATED APPLICATIONS

This application claims benefit under 35 U.S.C. §119(e) to the following U.S. Provisional Patent Applications: Provisional Patent Application No. 61/222,012, filed Jun. 30, 2009 and Provisional Patent Application No. 61/238,164, filed Aug. 30, 2009. Both of these are incorporated by reference herein in their entireties.

BACKGROUND OF THE INVENTION

Photovoltaic cells are widely used for generation of electricity, with multiple photovoltaic cells interconnected in module assemblies. Such modules may in turn be arranged in arrays and integrated into building structures or otherwise assembled to convert solar energy into electricity by the photovoltaic effect. An installation process for a solar module array involves connecting modules together at the installation site. A string of live modules connected in series is capable of delivering several amperes of current at lethal voltages, i.e., greater than 300 V.

SUMMARY OF THE INVENTION

Provided are low profile, water-resistant and touch safe electrical connector assemblies for solar modules. According to various embodiments, the electrical connector assemblies include a low-profile conductive stud, a low-profile sheath that surrounds the stud, and a socket to mate with the stud. The socket is further connected to a cable or other connector for module interconnection. According to various embodiments, the sheath and socket mate via keyed inter-engageable features. Also according to certain embodiments, the electrical connector assemblies are configured such that the socket is fastenable to the stud and/or sheath via snap fastening.

These and other aspects of the invention are described further below with reference to the figures.

DETAILED DESCRIPTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. For example, while the description below refers chiefly to electrical connector assemblies and the like for solar modules and solar module assemblies, they may be used with other electrical devices and assemblies. One of skill in the art will understand from the description presented herein how to implement the inventive electrical connectors and related methods described herein with other types of devices and assemblies that include electrical connections. Also, in the following description, numerous specific details are set forth in order to provide a thorough understanding of the present invention. The present invention may be practiced without some or all of these specific details. In other instances, well known mechanical apparatuses and/or process operations have not been described in detail in order not to unnecessarily obscure the present invention.

Photovoltaic cells are widely used for generation of electricity, with multiple photovoltaic cells interconnected in module assemblies. Such modules may in turn be arranged in arrays and integrated into building structures or otherwise assembled to convert solar energy into electricity by the photovoltaic effect. However, a string of live modules connected in series is capable of delivering several amperes of current at lethal voltages. During installation of solar module array, individual modules are interconnected. The present invention provides external electrical connector assemblies that enable safe and easy installation. According to various embodiments, the electrical connector assemblies described herein have one or more of the following features: low profile, finger safe, keyed, lockable and easy to install (e.g., without requiring installation tools and/or alignment).

Figure 1A:
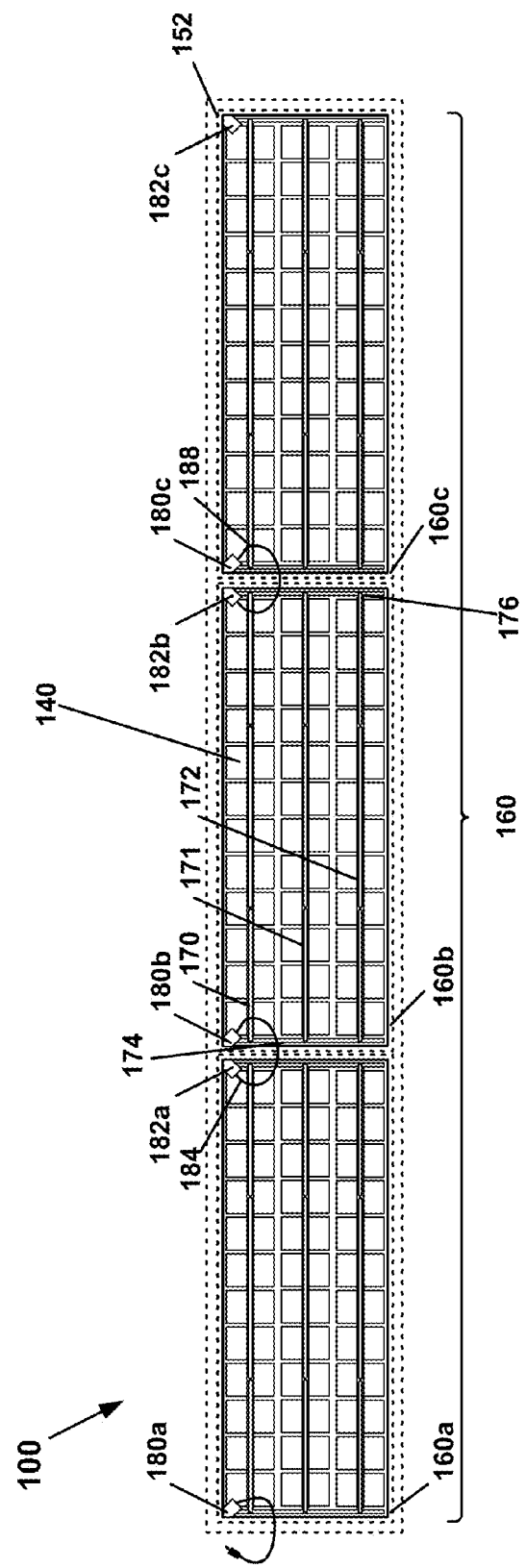
FIG. 1A shows a plan view of a solar-cell array including a plurality of solar-cell modules and centrally-mounted junction boxes in accordance with various embodiments.

Embodiments of the present invention relate to external electrical connector assemblies for solar modules. According to various embodiments, the external electrical connector assemblies described herein provide a connection point for solar modules to an external grid, battery, etc. In certain embodiments, one or more external electrical connector assemblies is associated with a solar module or panel in a solar panel array. An example of solar modules interconnected via external connector assemblies is shown in FIG. 1A. FIG. 1A shows a plan view 100 of a solar module array 152 including a plurality 160 of solar modules 160a, 160b and 160c. Each module includes a set of interconnected solar cells 140. The cells may be any type of photovoltaic cells, including but not limited to CIS, CIGS, CdTe or silicon photovoltaic cells. The plurality 160 of solar-cell modules 160a, 160b and 160c are interconnected via external connector assemblies mounted on the modules and connected to in-laminate-diode assemblies. For example, solar-cell module 160b includes a first in-laminate-diode assembly 170, a second in-laminate-diode assembly 171 and a third in-laminate-diode assembly 172; solar module 160b also includes a first busbar 174 and a terminating busbar 176 each electrically coupled with the first, second and third in-laminate-diode assemblies 170, 171 and 172. Although the figure depicts a specific in-laminate configuration of interconnected solar cells in which the cells are arranged in three rows, including in-laminate diode assemblies, etc., the invention is not limited to any particular arrangement of interconnected cells within the module, but may be used with any appropriate arrangement. Other variations are also within the scope of the invention.

The solar module 160b further includes first and second electrical connector assemblies 180b and 182b, mounted on the glass or other protective structure of the module. The first and second electrical connector assemblies 180b and 182b are configured to enable current collection from interconnected solar cells of the module 160b and to allow interconnection with at least one other external device, in this case module 160a for electrical connector assembly 180b, and module 160c for electrical connector assembly 182b. In embodiments of the present invention, the module 160b is coupled in series with modules 160a and 160c. Solar module 160a similarly includes external electrical connector assemblies 180a and 182a and solar module 160c similarly includes external electrical connector assemblies 180c and 182c. Solar modules 160a and 160b are intercoupled with interconnector 184 and solar modules 160b and 160c are intercoupled with interconnector 188. According to various embodiments, the modules may be connected in series, parallel, series-parallel, etc. The solar panel array may be mounted on a roof or other surface to absorb solar energy and convert it to electricity.

The modules and solar array described above is an example of solar module, electrical connector and array assemblies within the scope of the invention. The placement of the electrical connector assemblies may be varied appropriate on the module—at its center, edge, etc. Cell wiring schemes, including the presence, absence, number or arrangement of busbars and diodes may also be varied as appropriate. The shape of electrical connector assemblies according to embodiments of the invention may be varied as appropriate. As discussed further below, in certain embodiments, the electrical connector assemblies or components thereof have a generally circular shape to facilitate installation.

As used herein, the term "electrical connector assembly" refers to at least one lead or other conductive element configured to provide a conductive pathway, typically between the cells or internal circuitry of a solar module and one or more external cables or devices. In many embodiments, there are two such electrical connector assemblies per module, one providing a positive lead and one providing a negative lead. The electrical connector assemblies described herein may also be referred to as electrical connection boxes or junction boxes. In certain embodiments, the electrical connector assemblies described herein eliminate the need for junction boxes housing both positive and negative leads.

In certain embodiments, the electrical connector assemblies described herein include a conductive element, such as a conductive stud or pin, that is in electrical communication with the interconnected solar cells, and that extends from the interior of the module to the exterior of the module. The electrical connector assemblies may further include a sheath surrounding the conductive element, and a socket including a conductive portion to mate with the stud. In certain embodiments, the socket is configured to engage with the sheath. The electrical connector assemblies may further include a connector attached to or connectable to the socket for interconnection to other modules, etc. According to various embodiments, the connector assemblies may be in assembled or unassembled configurations.

According to various embodiments, the electrical connector assemblies described have a low profile, as measured as the greatest distance they extend above a module. Low profile assemblies facilitate low-cost manufacturing and provide less interference on the exterior of the module, making the module more stackable when compared to modules with high profile electrical connector assemblies. According to various embodiments, the profile is no more than about 2 inches, 1.9 inches, 1.8 inches, 1.7 inches, 1.6 inches, 1.5 inches, 1.4 inches, 1.3 inches, 1.2 inches, 1 inch, 0.9 inches, 0.8 inches, 0.7 inches, 0.6 inches, 0.5 inches, 0.4 inches, 0.3 inches, 0.2 inches or 0.1 inches.

In many embodiments, the stud of the low profile connector assemblies is short and squat. In conventional connectors, the conductive pin is long and narrow to reduce contact resistance. In certain embodiments, the studs described herein are squat forms, such as cylinders, with the contact primarily around their girths, rather along their lengths. The conductive element may extend above the module surface a distance of no more than about 1.5 inches, 1.4 inches, 1.3 inches, 1.2 inches, 1 inch, 0.9 inches, 0.8 inches, 0.7 inches, 0.6 inches, 0.5 inches, 0.4 inches, 0.3 inches, 0.2 inches or 0.1 inches.

In accordance with various embodiments, studs are provided including an insulative portion disposed on top of a conductive portion of the stud. When a sheath of the present invention is disposed around such a stud of a photovoltaic module, the non-conductive sheath has no opening sized to allow a finger to touch a conductive portion of the stud.

The connector assemblies described herein are finger-safe. As used herein, the term "finger-safe" refers to an assembly including a conductive element and sheath surrounding the conductive element such that there is no manner in which a finger-shaped object having a diameter of about 4 mm or larger can contact the conductive portion of the conductive element. In certain embodiments, finger-safe refers to the finger-safer requirements specified in Underwriters Laboratory publication UL-1703, Jun. 30, 2004, which is incorporated by reference herein.

In transport, solar modules are unconnected and require interconnection during installation. According to various embodiments, a solar module is provided to an installer with a conductive element and sheath mounted on the module. Interconnecting solar modules and/or connecting a solar module to an external battery, grid or other device, involves engaging a socket as described herein with the conductive element and sheath disposed on the module. The electrical connector assemblies described herein are finger-safe prior to, during and after such installation. An installer cannot contact any conductive part of the conductive element during installation.

In certain embodiments, the electrical connection assemblies are keyed. As used herein, the term "keyed" refers to having one or mechanical features that prevents connection to an incorrect component of the same type. As an example, in certain embodiments, the components of the electrical connector assemblies described herein are keyed, such that a positive lead from a module may be connected only to a negative socket and vice-versa. In certain embodiments, the electrical connector assemblies are lockable, such that once connected, they cannot be unconnected without the use of a tool.

In certain embodiments, the electrical connector assemblies have one or more features to facilitation easy installation. For example, in certain embodiments, the electrical connector assemblies do not require the use of a tool for installation but may be fit together, e.g., by snapping a socket onto a sheath and/or conductive elements. Also in certain embodiments, the electrical connectors do not require alignment prior to connection, but may be connected at any radial angle. For example, in certain embodiments, the electrical connector assemblies include a circularly keyed sheath member and a circularly keyed socket member. Once the keyed portions of each member are facing each other, the sheath and socket members can be fastened together at any relative radial angle due to the circular symmetry of the keyed inter-engageable features.

According to various embodiments, assembly of the socket member to the stud and/or sheath members includes snap fastening. In certain embodiments, one member includes an insertion component and another member includes a receiving component configured to fit around the insertion member and defining an insertion component receiving area. In certain embodiments, in its unassembled state the electrical connector assembly includes an insertion component having a diameter (or other length dimension in the case of non-cylindrical components) slightly larger than a diameter of the receiving member. In certain embodiments, one or both of the insertion component and the receiving component may include a feature such that the insertion component has a diameter slightly smaller than a diameter of the receiving component. For example, according to various embodiments, the insertion component may be flared slightly, with the flared portion of the insertion component having a larger area than the corresponding receiving area; the insertion component may have a ridge or one or more protrusions around its girth, with the diameter of the insertion component including the ridged or protruding portions larger than that of the receiving area; etc. According to various embodiments, the receiving component includes a narrowed portion and/or a ridge or one or more protrusions within the receiving area, or other features that narrow the receiving area so that it has a smaller diameter than the insertion component. Assembling the interconnect assembly may involve disposing the socket member over the sheath and/or stud members disposed on the module and applying a downward force on the socket member. This force causes one or more of the insertion component and the receiving components to flex or bend slightly, thereby allowing the receiving component to fit around the insertion component, and the insertion component to be inserted into the receiving area. According to various embodiments, the insertion component and/or the receiving component may be resilient such that after fitting, it partially or fully reverts to its original form. Various examples are presented in the below description. As indicated, the socket member may fit onto one or both of the stud (also referred to as conductive element) member and the sheath member in this fashion. In embodiments wherein the socket member engages with the stud member in this fashion, typically, though not necessarily, it is the stud that includes the insertion component, and the socket the receiving area. In certain embodiments, the sockets of the electrical connectors described herein are lockably engageable with a sheath and/or stud assembly.

In certain embodiments, once assembled, the electrical connector assemblies described herein, including conductive element member (also referred to as stud member or stud assembly), socket member and sheath member, contain substantially no air gaps. Also according to certain embodiments, the electrical connector assemblies include a seal surrounding a portion of the stud on the interior of the module.

Examples of electrical connector assemblies according to various embodiments are described below. FIGS. 1B-3 show various components of an electrical connector assembly according to certain embodiments, in which a non-conductive housing disposed over a conductive stud of a solar module has no opening sized to allow a finger to touch the stud. In certain embodiments, the housing is configured to allow detachment of a socket from the stud without subjecting a person who is performing the detachment to the risk of contact with the stud.

Figure 1B:
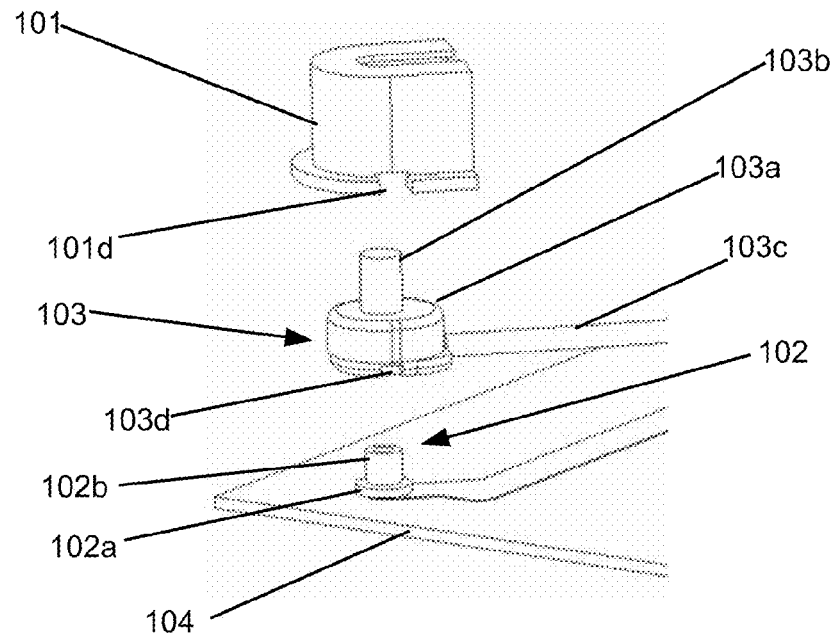
FIG. 1B is a perspective disconnected view of an electrical connector assembly according to certain embodiments.

First, FIG. 1B is a perspective disconnected view of the electrical connector assembly, also referred to as a junction box, including a housing 101, a horizontal connector 103, and a stud 102 disposed on a photovoltaic module 104. Module 104 includes interconnected solar cells (not shown) and other in-laminate components, encased by top and bottom encasing layers, the top one of which is a light transparent layer made of a material including but not limited to glass, plastic, or fiberglass. The bottom encasing layer may be made from a material such as glass, plastic, metal, or fiberglass. Stud 102 is a conductive material, typically a metal, and provides an electrical connection to the interconnected solar cells (not shown) within photovoltaic module 104.

In this embodiment, the stud 102 includes a circular base portion 102a and a cylindrical portion 102b. Base portion 102a is within the module glass. Socket member 103 includes a circular base portion 103a and a vertical nubbin 103b, which allows it to be fitted onto stud 102 sheathed by housing 101. Socket member 103 further includes attached horizontal connector 103c, which provides a conductive pathway from stud 102 to another module, battery, grid, etc. Socket member 103 may also include tool interface feature 103d for removal.

The module is delivered with housing 101, also referred to as a sheath, mounted on the module 104 disposed around the stud 102. Thus, even when socket member 103 including horizontal connector 103c is disconnected from the stud 102, the housing 101 shields the stud 102 preventing human contact with the stud 102.

Figure 2:
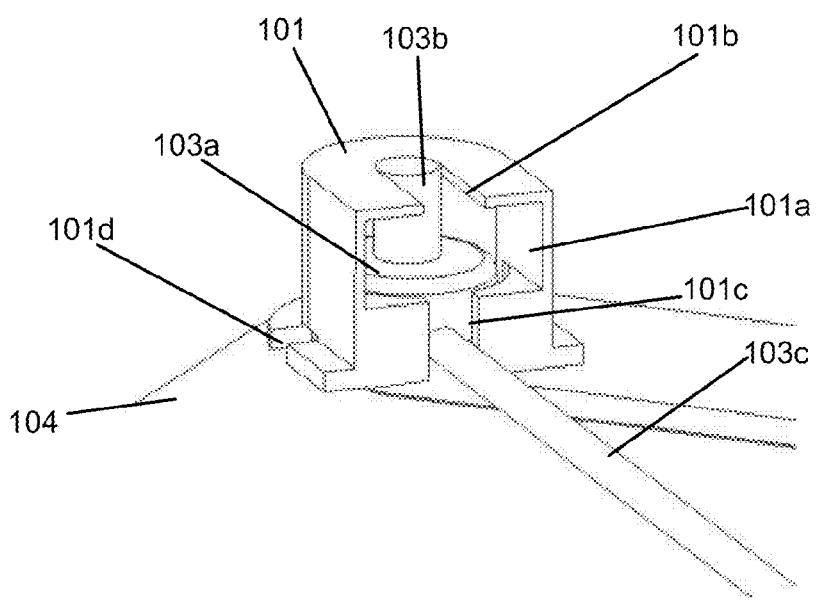
FIG. 2 shows the electrical connector assembly shown in FIG. 1B in an assembled configuration.

FIG. 2 shows the electrical connector assembly after connection. In its unconnected state, housing 101 is disposed on module 104, disposed around stud (not shown), which is in electrical communication with the cells of the solar module. To connect the horizontal connector 103c to stud 102, the socket member is inserted into an opening of housing 101, with the opening having a middle wide portion 101a, a top narrow portion 101b and a bottom narrow portion 101c. Circular base portion 103a of the socket member is inserted via a wide portion 101a of the opening and vertical nubbin 103b of the socket member is inserted via a narrow portion 101b of the opening. The socket member is then pressed onto the stud, with horizontal connector 103c extending through narrow opening portion 101c of the housing.

In certain embodiments, socket portion 103b may be fastened to cylindrical portion 102b via snap fastening. For example cylindrical portion 102b of stud 102 may be flared slightly at the end distal to the circular base portion 102a. Socket member 103 may include a hollow portion (not shown) slightly smaller than the flared portion of cylindrical portion 102b. On application of pressure to the vertical nubbin 103b, the socket member 103 is forced over the flared cylindrical portion 102b, fitting snugly into place.

In many embodiments, the socket member 103 including horizontal connector 103c can be installed without the use of a tool, but by application of pressure on the socket member 103 after it is inserted into housing 101. In certain embodiments, an installer may do this by pressing the socket member 103 with a hand. Once connected, however, the electrical connector assembly is configured to prevent easy removal. In certain embodiments, a tool is necessary for removal, e.g., by prying the socket member 103 off the stud 102. In the embodiment depicted in FIGS. 1B and 2, both housing 101 and socket member 103 have tool interface features 101d and 103d, respectively, allowing safe engagement with such a tool.

Figure 3:
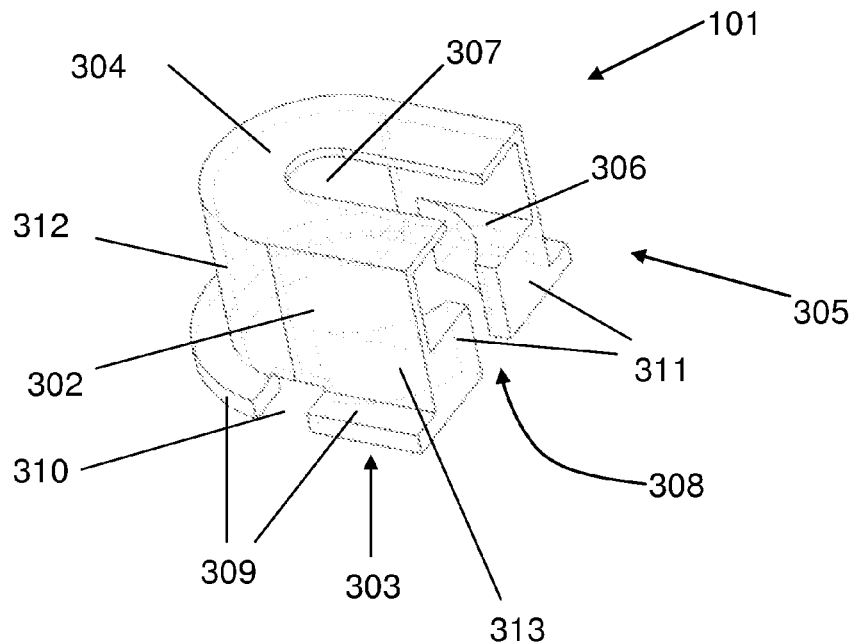
FIG. 3 is a perspective view of the sheath member depicted in FIGS. 1B and 2.

FIG. 3 is a perspective view of the housing 101, also referred to as a sheath, depicted in FIGS. 1B and 2. The housing 101 has an outer wall 302 including a round portion 312 and two opposing substantially flat portions 313, the two opposing substantially flat portions terminating at a front face 305. As described above, the front face 305 includes a front face opening 306 sized to allow a horizontal connector to enter the housing 101 and engage with a stud (102 in FIG. 1B) while substantially preventing a finger from touching the stud. The front face 305 further includes two opposing portions 311 extending inward and sized to allow a horizontal connector 103 to enter the front face opening 306 and engage with a stud. The housing 101 further includes a base portion 303 having a base opening 308. The base portion 303 includes panels 309 that form a tool opening 310 (tool interface feature 101d in FIG. 1) configured to allow a tool to enter to disconnect a horizontal connector. As described above with respect to FIGS. 1B and 2, the base opening 308 is sized to surround a socket member 103 including horizontal connector 103c connected to a stud 102 and is in communication with the front face opening 306. The housing 101 further includes a ceiling portion 304 having a ceiling opening 307 in communication with the front face opening 306. As described above, ceiling opening 307 is sized to allow a horizontal connector 103 including a vertical nubbin to enter through the front face opening 306.

Figure 4:
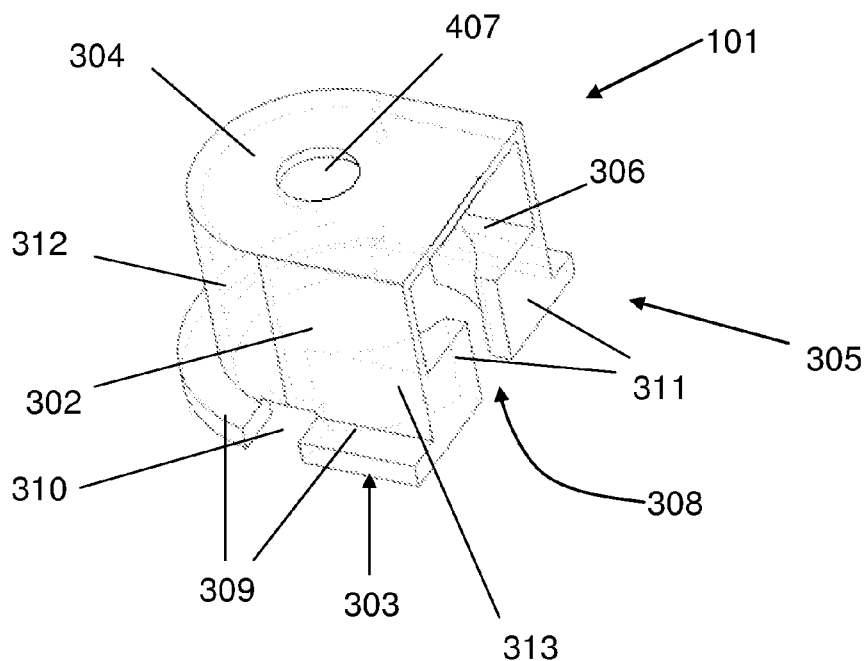
FIG. 4 is a perspective view of a sheath member that may be employed in accordance with certain embodiments.

FIG. 4 shows a housing 101 according to an alternative embodiment, in which a ceiling opening 407 is defined by the ceiling portion 304 and sized to allow a tool to enter to press down on a socket member to connect a horizontal connector to a stud. In this embodiment, a socket member would not need a vertical nubbin, such as nubbin 103b shown in FIG. 1B, as a tool entering via opening 407 could press down on a base member such as 103b of socket member 103 shown in FIG. 1B.

Figure 5:
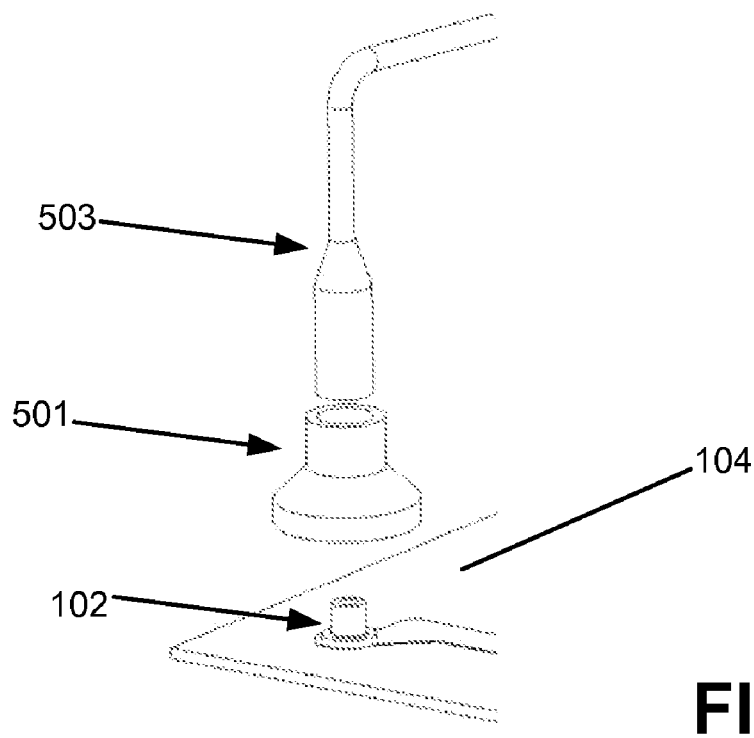
FIG. 5 is a perspective disconnected view of an electrical connector assembly having a shroud-type sheath according to certain embodiments.
Figure 6:
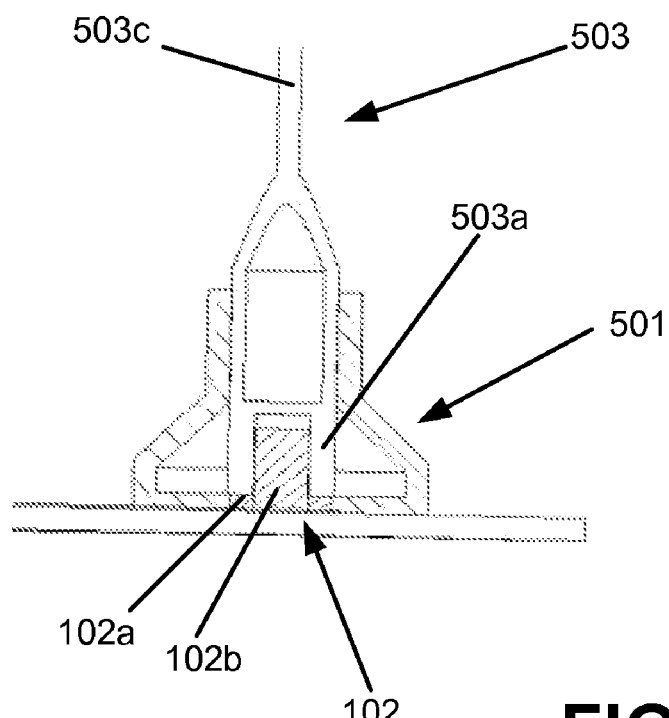
FIG. 6 is a cross-section view of the electrical connector assembly depicted in FIG. 5 in an assembled configuration.
Figure 7:
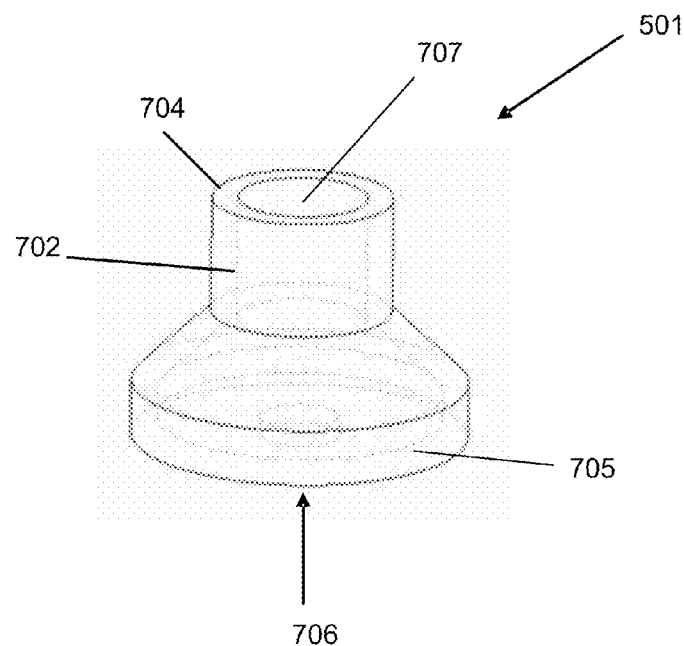
FIG. 7 is a perspective view of the sheath member depicted in FIGS. 5 and 6.

FIGS. 5-7 shows an electrical connector assembly having a shroud type housing according to another embodiment. First, FIG. 5 is a perspective disconnected view of a shroud-type housing 501, stud 102 and vertical socket member 503 including a vertical connector disposed on module 104. FIG. 6 is a cross-sectional view of a junction box with vertical connector 503 electrically connected to stud 102. When vertical connector 503 is disconnected from stud 102, shroud-type housing 501 sheaths stud 102, preventing human contact with stud 102.

FIG. 7 is a perspective view of a shroud-type housing 501. The shroud-type housing 501 includes a side wall 702 and a base 705. The base 705 has a base opening 706 sized to surround a socket connected to a stud 102. The side wall 702 has a substantially uniform thickness from the base 705 to the rim 704 formed by the top of the side wall 702. The diameter of the portion of the side wall 702 that connects to the base 705 is larger than the diameter of rim 704. The rim 704 has a rim opening 707 sized to allow a socket member 503 to engage therein.

Returning to FIG. 6, socket member 503 includes conductive portion 503a that is mated with stud 102 to provide an electrical connection to vertical connector 503c. In certain embodiments, socket member 503 may be mated with stud 102 via snap fastening. For example cylindrical portion 102b of stud 102 may be flared slightly at the end distal to the circular base portion 102a. The hollow portion of socket member 503 to be fit around stud 102 is smaller than the flared portion of circular base portion 102a. On application of pressure to the socket member 503, it is forced over the flared cylindrical portion 102b, fitting snugly into place. Once connected, the electrical connector assembly generally requires a tool for disassembly. As with the electrical connector assemblies described with reference to FIGS. 1B-4, the module is generally delivered with stud 102 connected to the solar cells within the module protective layers, and shroud 501 glued or otherwise affixed to the glass or other protective layer to thereby prevent human contact with the stud 102.

As indicated above, in certain embodiments, the stud members are flared at the top, allowing the socket members to snap into place upon application of force. As force is applied, the stud and/or socket member material flexes or bends sufficiently to allow the socket member to fit over the stud. In certain embodiments, the material is resilient such that it flexes or expands back once the components are mated. In certain embodiments, the socket members described above may have a lip or protrusions extending inward from hollow portion of the socket, creating a smaller diameter at the rim or protrusions. In these embodiments, the stud may or may not be flared as described above.

In certain embodiments, a stud of an electrical connector assembly includes insulation disposed thereon. In certain embodiments, this feature allows a low profile sheath to be used. For example, in certain embodiments, a sheath is approximately the height of the stud. Also, in certain embodiments, sheaths having features configured to engage with a portion of a socket member are provided. Furthermore, in certain embodiments, a sheath is keyed to allow only a mated socket to be engaged thereon. For instance, a first embodiment of a junction box sheath could be keyed with a first key configuration that would only allow a socket to be engaged thereon, wherein this first keyed configuration would only be disposed on positively charged connectors. Furthermore, a junction box sheath with a second key configuration which would only allow a mated socket to be engaged thereon could be employed on only negatively charged connectors. The use of differentiated configurations as described above could substantially prevent cross connection of electrical connectors, thus preventing shorting of the system or module.

Figure 8:
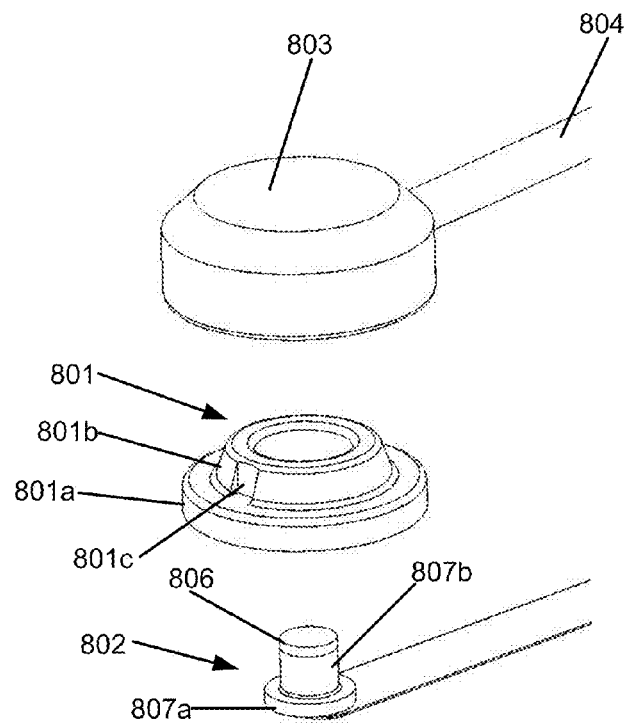
FIG. 8 is a perspective disconnected view of a low profile electrical connector assembly including a keyed low profile sheath and a keyed socket member according to certain embodiments.

FIG. 8 is a perspective disconnected view of a keyed low profile sheath 801, a conductive stud 802 including base conductive portion 807a, cylindrical conductive portion 807b, and insulated top portion 806, and a keyed socket member 803. Keyed socket member 803 is configured to engage with the keyed low profile sheath 801 and further connected to a horizontal connector 804. In use, stud 802 is mounted on a solar module surrounded by sheath 801, which is glued or otherwise affixed to the module. Sheath 801 includes at least one feature that allows only a socket 803 having corresponding features to be connected to stud 802. Here, sheath 801 includes a base portion 801a and a raised rim 801b having indent 801c. Assembled, raised rim 801b surrounds at least the conductive portion of the stud 802. Indent 801c is configured to engage a corresponding tab feature on socket 803. It prevents sockets having unaligned tab features from connecting to stud 802. The inner diameter of raised rim 801b is sized to allow a hollow conductive portion (not shown) of socket member 803 to fit between the raised rim 801b and stud 802, with the gap between the raised rim 801b and stud 802 small enough to prevent a human finger from contacting the conductive portions 807a and 807b of stud 802 when the socket is not in place. In certain embodiments, the outer diameter of rim 801b is sized to fit only sockets having a corresponding groove and preventing sockets having grooves of different diameters from connecting to stud 802.

Figure 9:
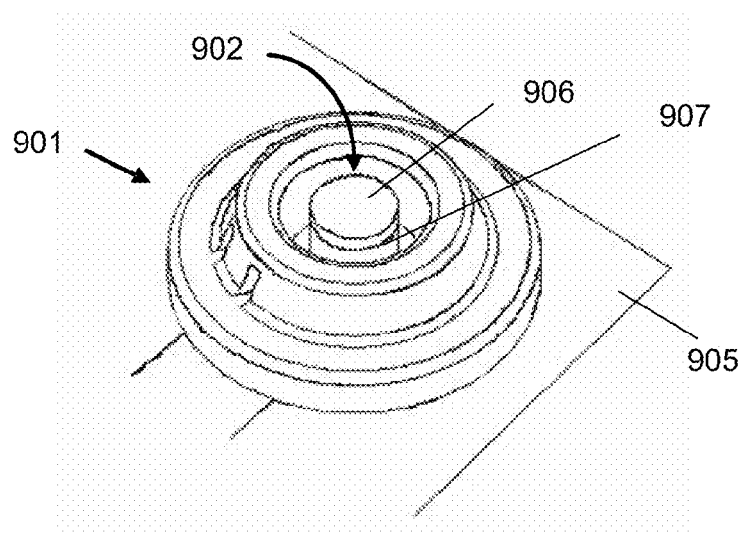
FIG. 9 is a perspective view of a keyed low profile sheath and stud assembly disposed on a photovoltaic module according to certain embodiments.

FIG. 9 is a perspective view of a keyed low profile sheath 901 and stud assembly 902 disposed on a photovoltaic module 905. The keyed low profile sheath 901 provides protection around the exterior of the stud assembly 902 while the insulator portion 906 of the stud assembly 902 provides protection on the top portion of the stud assembly 902. As shown, the conductive portion 907 of the stud assembly 902 is not accessible to human contact, significantly reducing the risk of electric shock when modules are installed or when they undergo maintenance.

Figure 10:
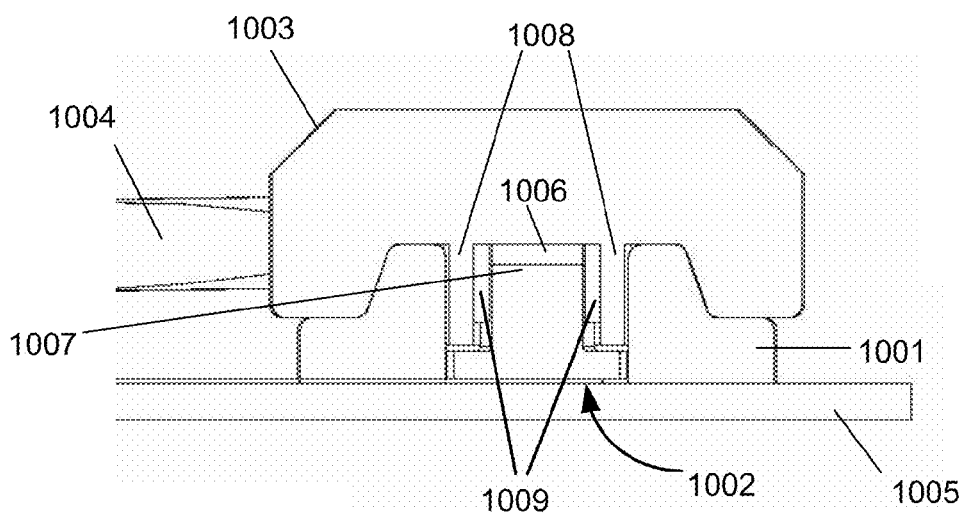
FIG. 10 is a cross-sectional view of a low profile electrical connector assembly including a keyed low profile sheath and a keyed socket member in an assembled configuration according to certain embodiments.

FIG. 10 is a cross-sectional view of a keyed electrical connector assembly according to certain embodiments, including keyed low profile sheath 1001 and stud assembly 1002 disposed on a photovoltaic module 1005 and a keyed socket 1003 disposed on and electrically connected to stud assembly 1002 and engaged on the keyed low profile sheath 1001. The keyed socket 1003 is further connected to a horizontal connector 1004 and includes a stud engaging portion 1008. Stud engaging portion 1008 includes an electrically conductive portion 1008, which is electrically integrated with the conductive portion 1007 of the stud assembly 1002. Stud assembly 1002 also includes insulative portion 1006. In certain embodiments, socket member 1003 mates with stud assembly 1002 via snap fastening. The portion of stud 1002 distal to the module 1005 may be flared, and have a slightly larger diameter than that of the hollow portion of socket member 1003, the sidewalls of which are defined by stud engaging portion 1008. When a downward force is applied to socket member 1003, the engaging portion 1008 bends or flexes sufficiently such that it fits snugly into the space between cylindrical portion 1007 of stud 1002 and the inner diameter of sheath 1001. Once connected, a conductive pathway from stud 1002 to horizontal connector 1004 is established via the conductive portion 1009 of stud engaging portion 1008 of socket member 1003.

Figure 11:
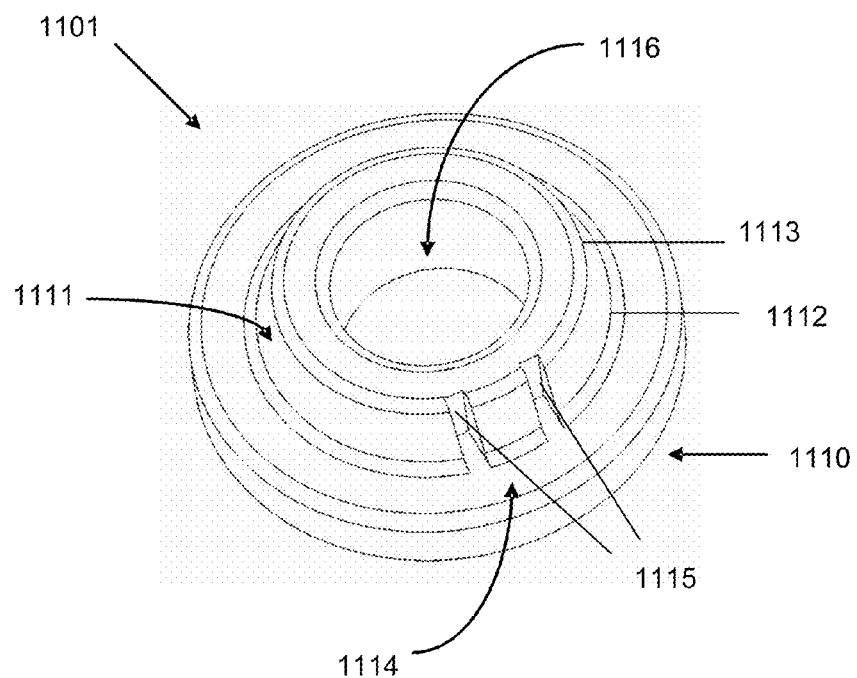
FIG. 11 is a perspective view of a keyed low profile sheath according to one embodiment of the present invention.

FIG. 11 is a perspective view of a keyed low profile sheath 1101 according to one embodiment of the present invention. The keyed low profile sheath 1101 has a support portion 1110 having a first diameter and a torso portion 1111 that has a base 1112 with a second diameter and ceiling 1113 with a third diameter. The diameter of the base 1112 of the torso portion 1111 is smaller than the diameter of the support portion 1110. The diameter of the ceiling 1113 of the torso portion 1111 is smaller than the diameter of the base 1112 of the torso portion 1111. The torso portion 1111 further includes a keyed portion 1114 that includes two slots 1115 configured to engage a keyed portion of a keyed socket (see keyed portion 1216 of keyed socket 1203 in FIG. 12). The low profile sheath 1101 further includes a center opening 1116 configured to surround a stud assembly and accommodate an engaging portion of a keyed socket (see engaging portion 1208 of socket 1203 in FIG. 12).

Figure 12:
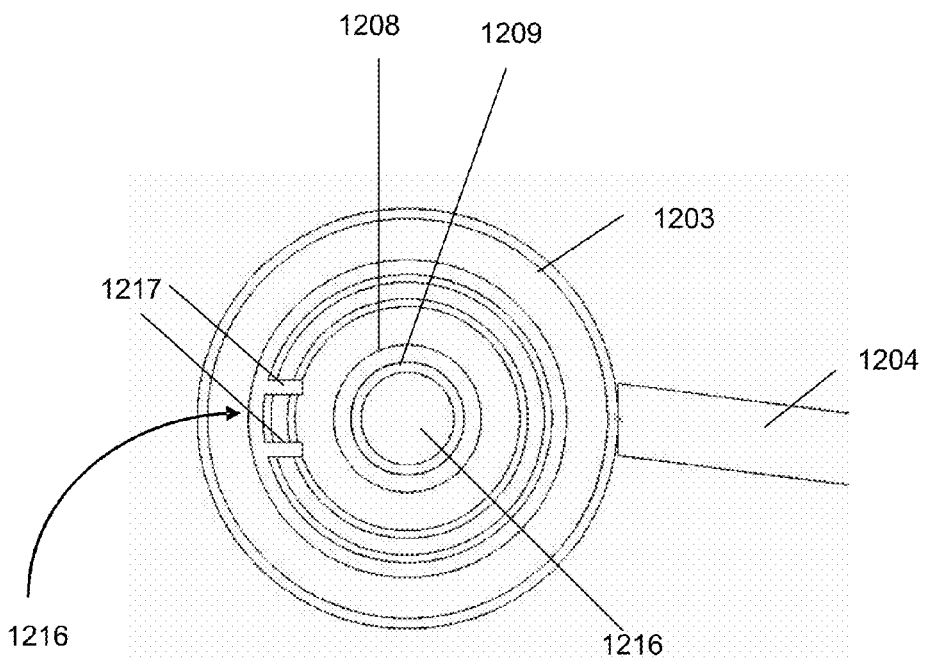
FIG. 12 is an underneath view of a keyed socket according to one embodiment of the present invention.

FIG. 12 is an underneath view of a keyed socket 1203 connected to a horizontal connector 1204. Keyed socket 1203 is configured to be mated with a keyed low profile sheath consistent with the embodiment shown in FIG. 11. The keyed portion 1216 of the keyed socket 1203 includes two prongs 1217 that are configured to fit into two slots 1115 disposed on the keyed low profile sheath 1101 shown in FIG. 11. Keyed socket 1203 also includes stud engaging portion 1208 including conductive portion 1209. A recess 1216 is configured to receive a stud.

Figure 13:
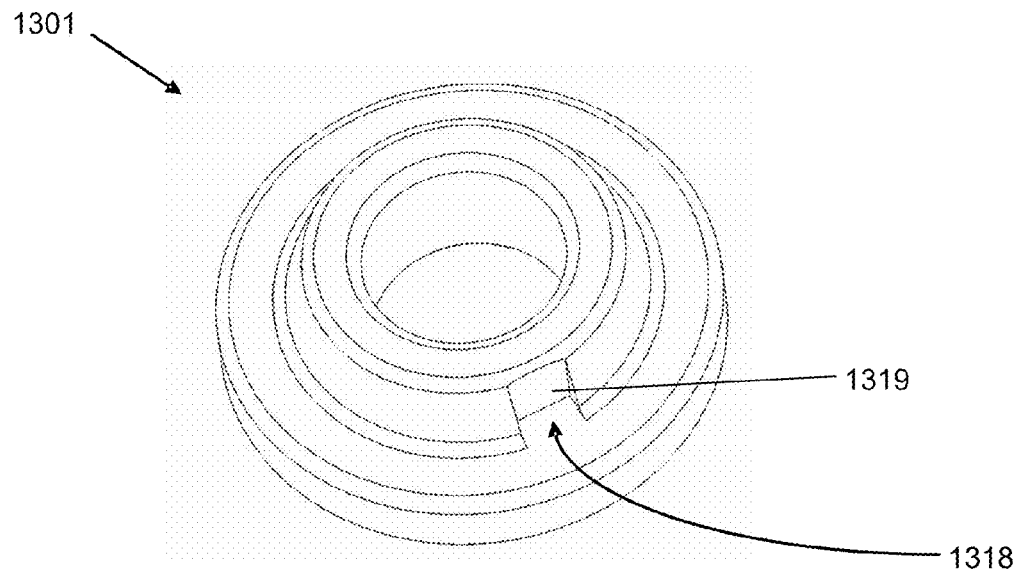
FIG. 13 is a perspective view of a keyed low profile sheath according to one embodiment of the present invention.

FIG. 13 is a perspective view of a keyed low profile sheath 1301 showing another example of a sheath according to certain embodiments. The keyed low profile sheath 1301 is similar to the keyed low profile sheath 1101 of FIG. 11, with the exception that the keyed portion 1318 includes a single slot 1319 configured to engage a keyed portion 1420 of a socket 1403 (see FIG. 14).

Figure 14:
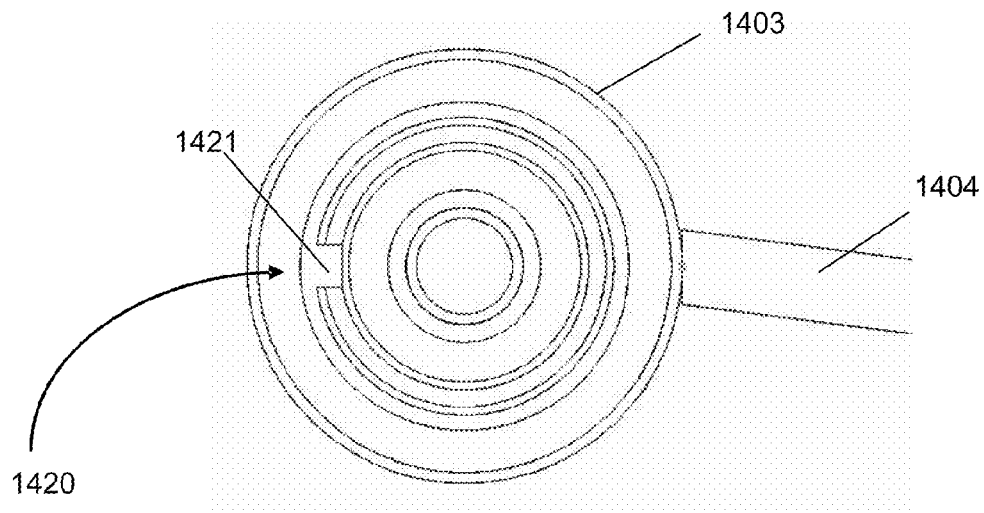
FIG. 14 is an underneath view of a keyed socket according to one embodiment of the present invention.

FIG. 14 is an underneath view of a keyed socket 1404 connected to a horizontal connecter 1404. The keyed socket 1403 is configured to be mated with a keyed low profile sheath 1301 consistent with the embodiment shown in FIG. 13. The keyed portion 1420 of the keyed socket 1403 includes one prong 1421 that is configured to fit into the slot 1319 disposed on the low profile sheath 1301 shown in FIG. 13.

The keyed socket 1403 shown in FIG. 14 would not be able to engage on the keyed low profile sheath 1101 shown in FIG. 11 as the prong 1421 would not be able to fit into either of the two slots 1115 of the keyed low profile sheath 1101. Similarly, the keyed socket 1203 shown in FIG. 12 would not be able to engage on the keyed low profile sheath 1301 shown in FIG. 13 as the two prongs are spaced too far apart to be able to fit into the slot 1319 of the keyed low profile sheath 1301.

In practice, keyed low profile sheaths and their mated sockets may be used to distinguish positive and negative connectors to decrease the likelihood of cross connection. It should be noted that slot features 1115 and 1318 may be on a socket members with prong features 1217 and 1421 on sheath members. Moreover, the keyed features are not limited to slots and corresponding prongs, but may be any type of inter-engageable keyed features. As discussed further below, in certain embodiments, circular keyed features that do not require rotational alignment are provided.

Figure 15:
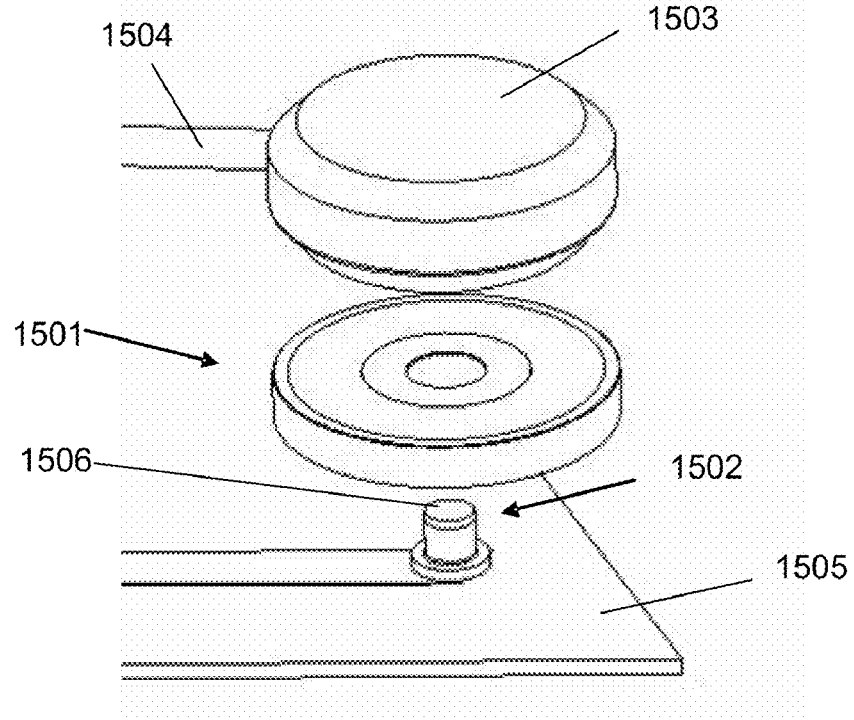
FIG. 15 is a perspective disconnected view of an electrical connector assembly including a circularly keyed low profile sheath and a circularly keyed socket according to certain embodiments.
Figure 16:
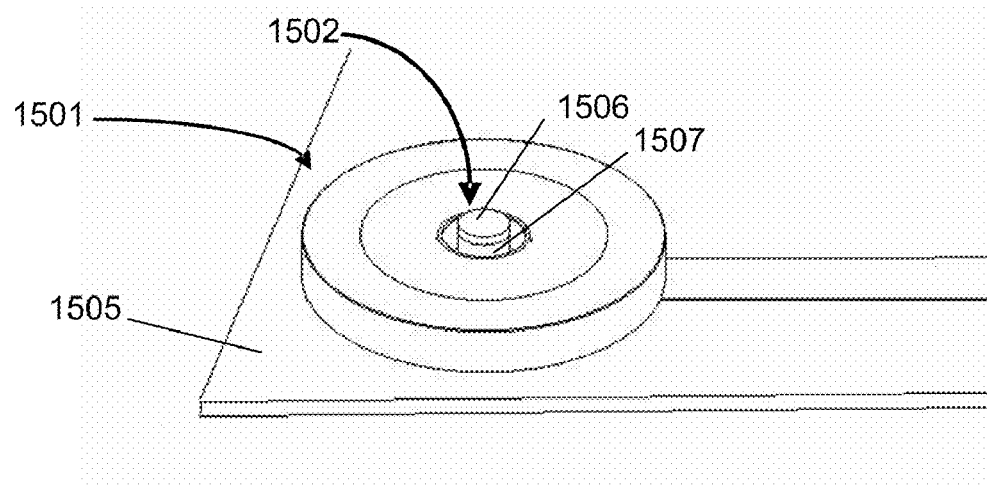
FIG. 16 is a perspective view of a circularly keyed low profile sheath and conductive stud assembly disposed on a photovoltaic module according various embodiments.

FIG. 15 is a perspective, disconnected view of a circularly keyed low profile sheath 1501, a conductive stud assembly 1502 including insulating top portion 1506 connected to solar cells within photovoltaic module 1505, and a circularly keyed socket 1503 configured to be mated with the circularly keyed low profile sheath 1501. The circularly keyed socket is further connected to a horizontal connector 1504. FIG. 16 is a perspective view of certain assembled components of an electrical connector assembly including a circularly keyed low profile sheath 1501 and conductive stud assembly including conductive portion 1507 and insulative portion 1506, disposed on a photovoltaic module 1505. According to certain embodiments, the module 1502 is shipped as shown, with sheath 1501 affixed to the module surface and surrounding stud assembly 1502. The circularly keyed low profile sheath 1501 provides protection around the exterior of the conductive stud assembly 1502 while the insulating top portion 1506 of the conductive stud assembly 1502 provides protection on the top portion of the conductive stud assembly. As shown, the conductive portion 1507 of the conductive stud assembly is not accessible to human contact, significantly reducing the risk of electric shock when installing or maintaining photovoltaic modules.

Figure 17:
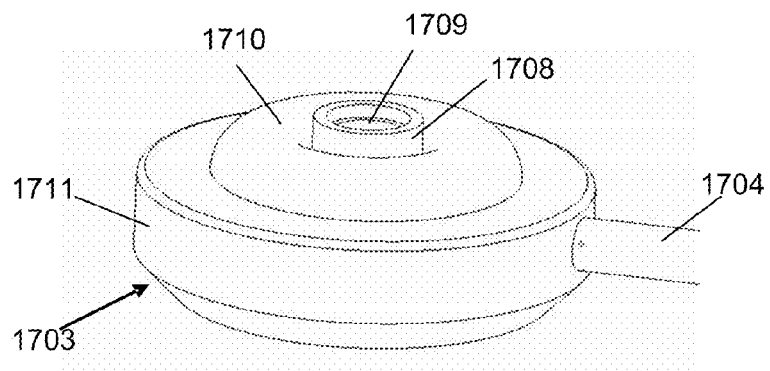
FIG. 17 is a perspective view of a circularly keyed socket in accordance with one embodiment of the present invention.
Figure 18:
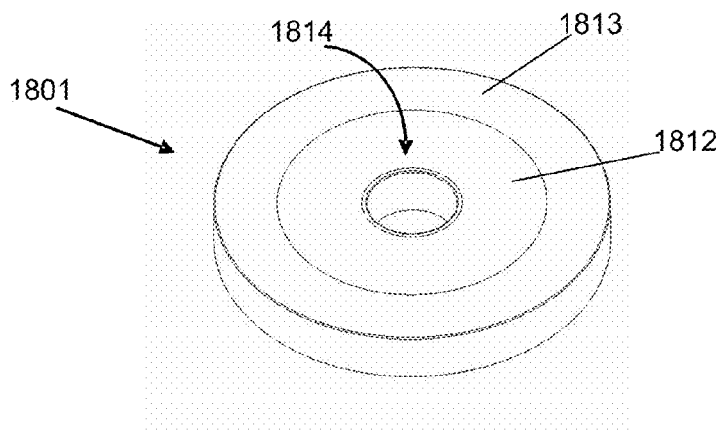
FIG. 18 is a perspective view of a circularly keyed low profile sheath in accordance with one embodiment of the present invention.

FIG. 17 is a perspective view of a circularly keyed socket 1703 (shown sheath- and stud-engaging side up) in accordance with one embodiment of the present invention. The socket 1703 is further connected to a horizontal connector 1704. Circularly keyed socket 1703 is configured to be mated with a circularly keyed low profile sheath 1801 (shown in FIG. 18). Socket 1703 is circularly keyed, that is the keyed portion 1710 disposed on the base portion 1711 includes a circular protruding shape that is configured to fit in a circular groove 1812 (FIG. 18) disposed on the circularly keyed low profile sheath 1801 (FIG. 18). In the depicted in embodiment, there are no other keyed features such as slots or prongs on socket 1703; as a result, fitting socket 1703 to sheath 1801 depicted in FIG. 18 does not require any rotational alignment of keyed features. Rather, once socket 1703 is centered over sheath 1801, it may connected at any rotational angle. Circularly keyed socket 1703 further includes a stud engaging portion 1708 including an electrically conductive portion 1709 which is configured to be electrically integrated with a conductive portion of a conductive stud assembly.

FIG. 18 is a perspective view of a circularly keyed low profile sheath 1801 according to one embodiment of the present invention. The keyed low profile sheath 1801 is configured to be mated with a circularly keyed low profile socket 1703 as shown in FIG. 17. The circularly keyed low profile sheath 1801 has a base portion 1813 and a circular groove portion 1812 configured to engage a keyed portion 1810 of the circularly keyed socket 1703 in FIG. 17. The circularly keyed low profile sheath 1801 further includes a center opening 1814 configured to surround a conductive stud assembly (1902 in FIG. 19) and engage the portion 1708 of the circularly keyed socket 1703.

Figure 19:
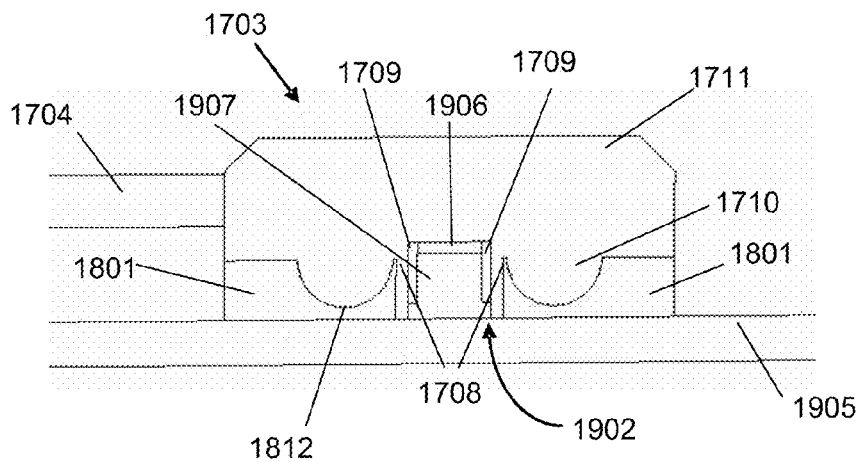
FIG. 19 is a cross-sectional view of an electrical connector assembly including a circularly keyed low profile sheath mated with a circularly keyed socket member in accordance with one embodiment of the present invention

FIG. 19 is a cross-sectional view of an electrical connector assembly including a circularly keyed low profile sheath 1801 and a conductive stud 1902 disposed on a photovoltaic module 1905. A circularly keyed socket 1703 is engaged with circularly keyed low profile sheath 1801 and conductive stud 1902 and further connected to a horizontal connector 1704, thereby electrically connecting conductive stud 1902 and horizontal connector 1704. Stud assembly 1902 includes insulative portion 1906 disposed on top of the conductive portion 1907 of the stud assembly 1902. The keyed socket 1703 is engaged on the conductive stud assembly 1902 through the stud engaging portion 1708. As shown, the keyed portion 1710 of the circularly keyed socket 1703 fits into the circular groove portion 1812 of the circularly keyed low profile sheath 1801 allowing the stud engaging portion 1708 of the circularly keyed socket 1703 to engage with the conductive stud assembly 1902. In certain embodiments, stud engaging portion 1708 of socket 1703 engages with stud 1902 via snap fastening as described above, with stud 1902 the insertion component, stud engaging member 1708 (including conductive portion 1709) the receiving component and the hollow cylindrical area defined by stud engaging member 1708 (including conductive portion 1709) and base portion 1711 the receiving area. As shown in the cross-sectional view in FIG. 19, the assembled electrical connector assembly contains no air gaps inside the assembly. This may be advantageous as provides an electrical connector assembly that does not have any spaces in which condensation can form and that does not require electrically insulative potting material to be placed in air gaps.

Figure 20:
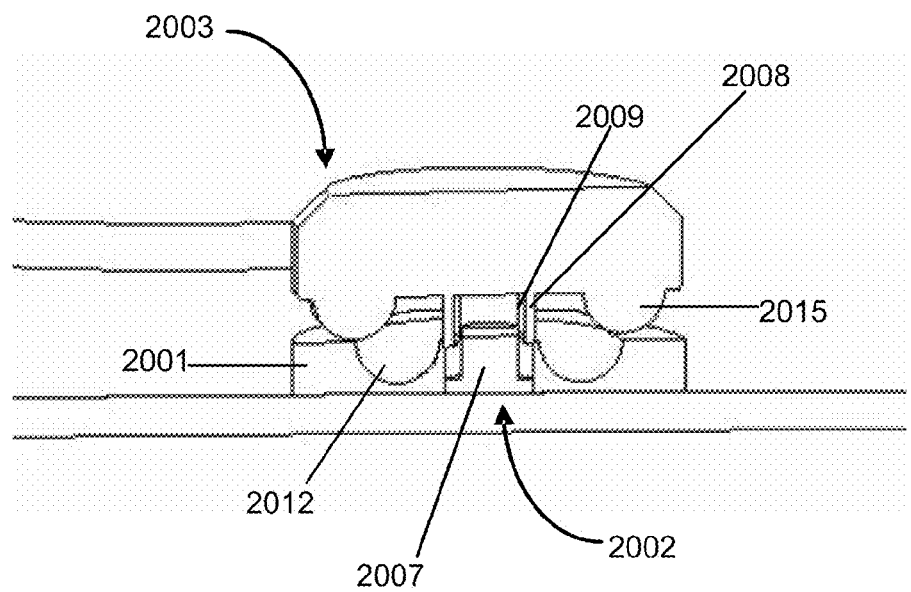
FIG. 20 is a cross-sectional view of a circularly keyed low profile sheath and a mismatched circularly keyed socket disposed above the sheath.

FIG. 20 is a cross-sectional view of a circularly keyed low profile sheath 2001 and a mismatched circularly keyed socket 2003 disposed above the sheath 2001. Because keyed feature (circular protrusion) 2015 on socket 2003 and keyed feature (circular groove) 2012 on sheath 2001 are not configured to inter-engage, having different diameters, stud engaging portion 2008 of socket 2003 is prevented from engaging stud 2002. In certain embodiments, the conductive portion 2009 of stud engaging portion 2008 is prevented from contacting the conductive portion 2007 of stud 2002. As described above, keyed low profile sheaths and their mated snap fastener sockets as described above could be used to distinguish positive and negative connectors to decrease the likelihood of cross connection.

Figure 21:
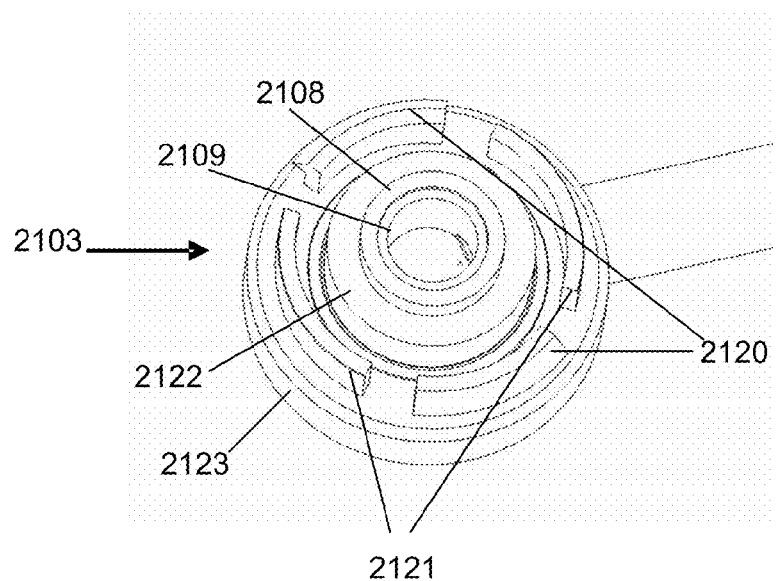
FIG. 21 is a perspective view of a circularly keyed lockable socket in accordance with certain embodiments

In certain embodiments, the keyed socket may be configured to be lockably engageable with a keyed low profile sheath in order to provide additional security to the electrical connections. FIG. 21 is a perspective view of a circularly keyed lockable socket 2103 in accordance with certain embodiments. Circularly keyed lockable socket 2103 is configured to be mated with circularly keyed lockable low profile sheath 2201 (shown in FIG. 22). Circularly keyed lockable socket 2103 includes a stud engaging portion 2108 including an electrically conductive portion 2109 which is configured to be electrically integrated with a conductive portion 2307 (shown in FIG. 23) of a conductive stud assembly. Socket 2103 includes a keyed portion disposed on a base portion 2123 of the circularly keyed lockable socket 2103. The keyed portion 2122 includes a circular ridge having a first diameter that is the same as the outer diameter of the stud engaging portion 2108 and a second diameter that is larger than the outer diameter of the stud engaging portion 2108. The keyed portion 2122 is configured to fit into a circular opening 2227 defined by circular ridge 2225 of circularly keyed lockable low profile sheath 2201 (shown in FIG. 22). Circularly keyed lockable socket 2103 further includes rimmed locking portions 2120 configured to engage with ridged lock accepting portions 2224 of circularly keyed lockable low profile sheath 2201 (shown in FIG. 22). Circularly keyed lockable socket 2103 further includes supporting ridges 2121 that are in a circumferential line with the rimmed locking portions 2120.

Figure 22:
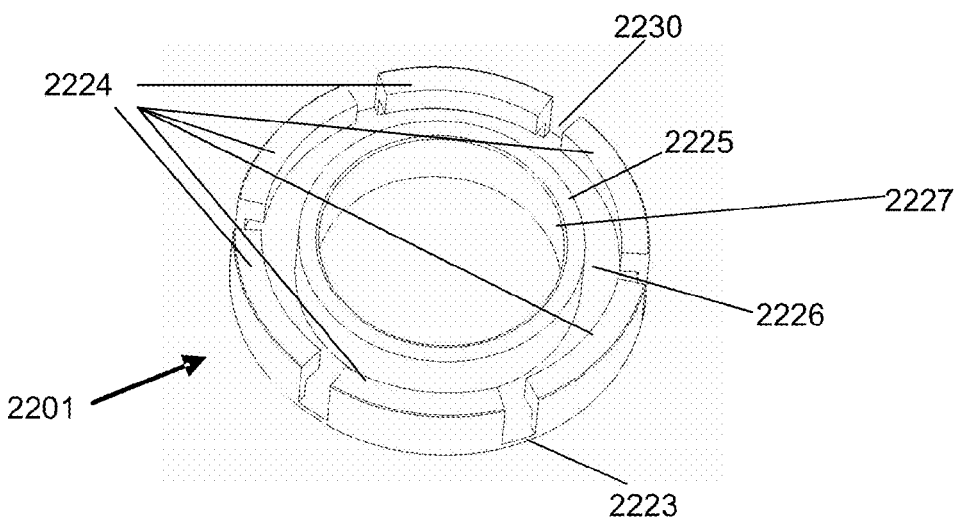
FIG. 22 is a perspective view of a circularly keyed sheath in accordance with certain embodiments.

FIG. 22 is a perspective view of a circularly keyed lockable low profile sheath 2201 in accordance with one embodiment of the present invention. The circularly keyed lockable low profile sheath 2201 is configured to be mated with circularly keyed lockable socket 2103 shown in FIG. 21. Circularly keyed lockable low profile sheath 2201 has an annular base portion 2223 and a circular ridge 2225 that defines a center opening 2227 in sheath 2201. The center opening 2227 is configured to engage a keyed portion 2122 of circularly keyed lockable socket 2103 shown in FIG. 21. The circularly keyed lockable low profile sheath 2201 is further configured to surround a conductive stud assembly 2301 (shown in FIG. 23) to provide a barrier to decrease risk of electrical shock. The circularly keyed lockable low profile sheath 2201 further comprises ridged lock accepting portions 2224 that are configured to engage rimmed locking portions 2120 of the circularly keyed lockable socket 2103 shown in FIG. 21. Ridged lock accepting portions 2224 are separated by a gap 2230 in this embodiment to allow a tool to engage and disconnect the socket 2103.

Socket 2103 may be fastened during assembly to sheath 2201 via snap fastening. In this example, rimmed locking portions 2120 are inserted into an annular receiving area defined by ridged locked accepting portions 2224, annular base portion 2223 and circular ridge 2225. Prior to fastening, the outer diameter of rimmed locking portions 2120 is larger the outer diameter of this receiving area. During assembly, a force is applied to socket 2103, causing rimmed locking portions 2120 to flex and slip past ridged locked accepting portions 2224. Rimmed locking portions 2120 then flex back into position, snapping into place locked into place under ridged lock accepting portions 2224.

Figure 23:
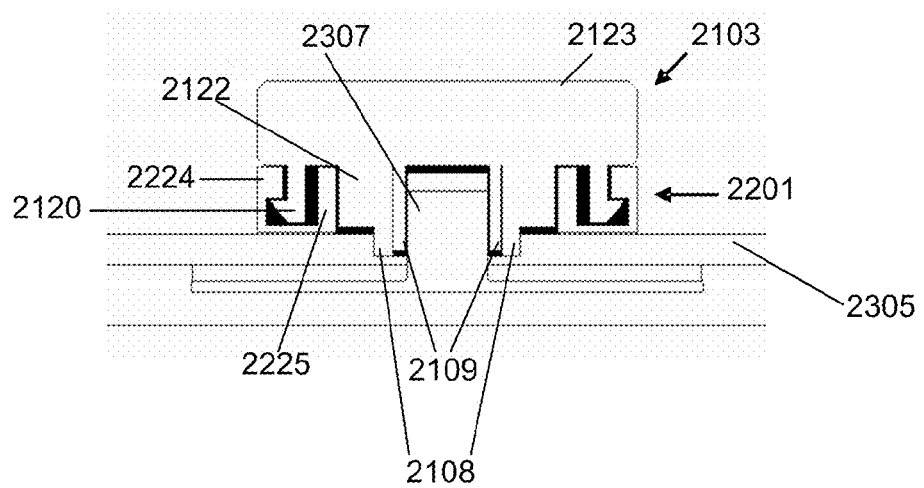
FIG. 23 is a cross-sectional view of an electrical connector assembly including a circularly keyed low profile sheath and a circularly keyed locked socket member in accordance with one embodiment of the present invention.

FIG. 23 is a cross-sectional view of an assembled electrical connector assembly including circularly keyed socket 2103 (as depicted in FIG. 21), circularly keyed lockable low profile sheath 2201 (as depicted in FIG. 22) disposed on a photovoltaic module 2305 with a stud assembly including conductive portion 2307 extending from the interior of module 2305. The shaded areas in FIG. 23 are included for clarity and are intended to show open spacing in the assembly. Stud engaging portion 2019 and base portion 2123 of socket 2103 define a hollow area in which the stud is received. Circularly keyed lockable socket 2103 is engaged with the conductive portion 2307 of the stud assembly through the conductive portion 2109 of stud engaging portion 2108 and is also engaged with the circularly keyed lockable low profile sheath 2201 through keyed portion 2122. As shown in FIG. 23, rimmed locking portions 2120 of the circularly keyed lockable socket 2103 are engaged with the ridged lock accepting portions 2224 of circularly keyed lockable low profile sheath 2201. The engagement of the rimmed locking portions 2120 of the of the circularly keyed lockable socket 2103 with the ridged lock accepting portions 2224 of circularly keyed lockable low profile sheath 2201 provides a locking mechanism that renders removal of the circularly keyed lockable socket 2103 impossible or extremely difficult without the use of a removing tool.

Figure 24:
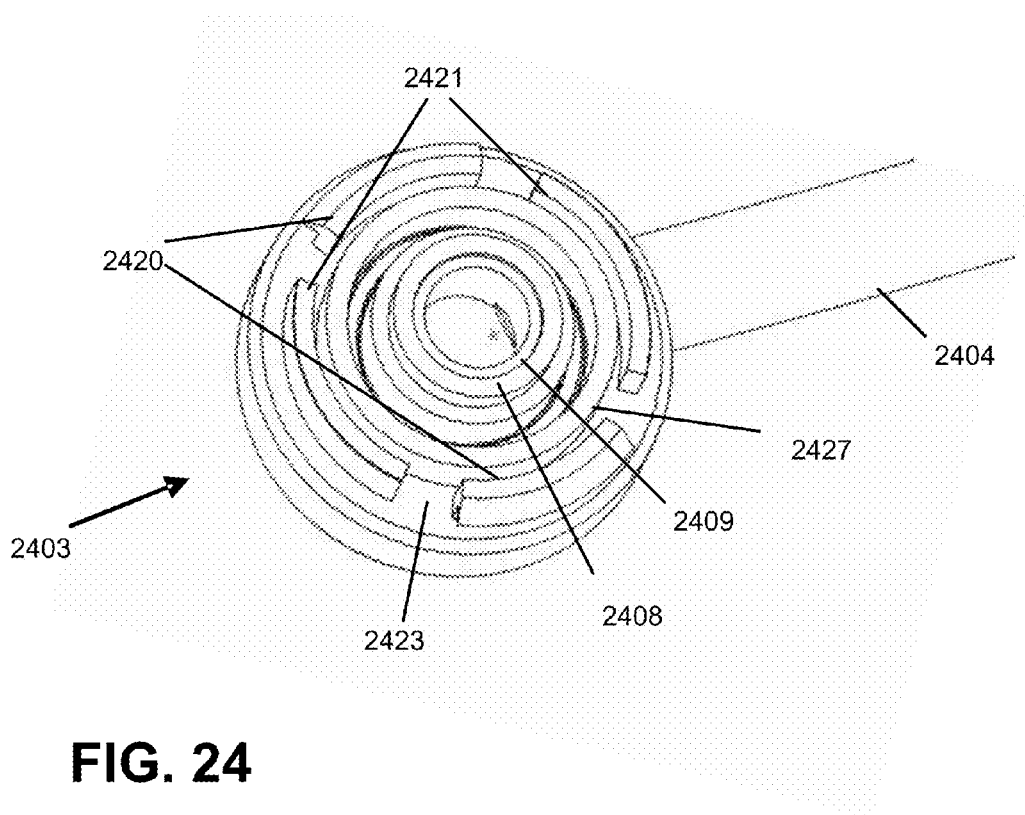
FIG. 24 is a perspective view of a circularly keyed lockable socket in accordance with certain embodiments
Figure 25:
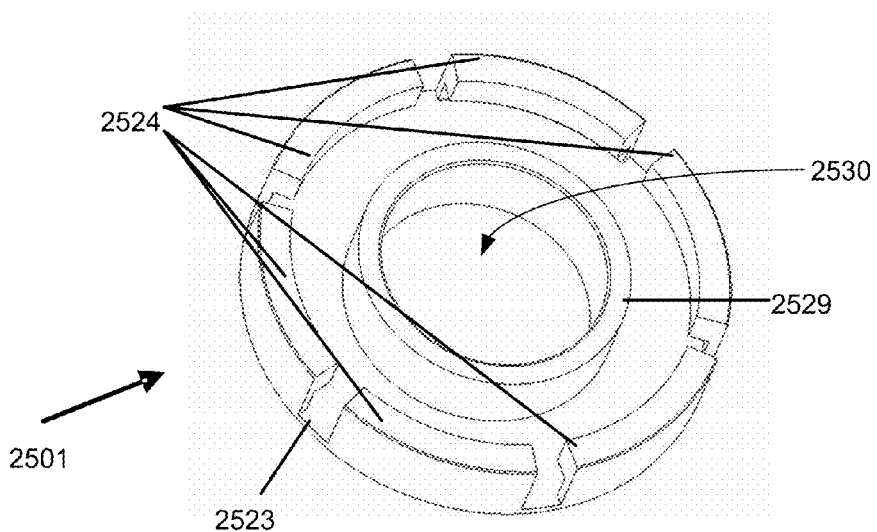
FIG. 25 is a perspective view of a circularly keyed sheath in accordance with certain embodiments.

FIG. 24 is a perspective view of a circularly keyed lockable socket 2403 in accordance with an alternative embodiment of the present invention. Circularly keyed lockable socket 2403 is configured to be mated with a circularly keyed lockable low profile sheath 2501 (shown in FIG. 25). Circularly keyed lockable socket 2403 includes a stud engaging portion 2408 including an electrically conductive portion 2409 which is configured to be integrated with a conductive portion of a conductive stud assembly. Circularly keyed lockable socket 2403 includes a keyed portion 2427 disposed on a base portion 2423, the keyed portion including a circular protruding ridge having a first diameter that is larger that the outer diameter of the stud engaging portion 2408 and a second diameter that is larger than the first diameter of the keyed portion 2427. The keyed portion 2427 is configured to fit around a circular ridge 2529 of the circularly keyed lockable low profile sheath 2501 show in FIG. 25. Circularly keyed lockable socket 2403 further includes rimmed locking portions 2420 configured to engage with ridged lock accepting portions 2524 of circularly keyed lockable low profile sheath 2501 (FIG. 25). Circularly keyed lockable socket 2403 further includes supporting ridges 2421 that are in circumferential line with the rimmed locking portions 2420.

FIG. 25 is a perspective view of a circularly keyed lockable low profile sheath 2501 in accordance with embodiments of the present invention. The circularly keyed lockable low profile sheath 2501 is configured to be mated with circularly keyed lockable socket 2403 (FIG. 24). Circularly keyed lockable low profile sheath 2501 has an annular base portion 2523 and a circular ridge 2529 that defines a center opening 2530 in the center of the sheath 2501. The center opening 2530 is configured to accept a stud engaging portion 2408 of the circularly keyed lockable socket 2403 and to surround a conductive stud assembly of a photovoltaic module in order to provide a barrier to decrease risk of electrical shock. The circularly keyed lockable low profile sheath 2501 further includes ridged lock accepting portions 2524 that are configured to engage rimmed locking portions 2420 of the circularly keyed lockable socket 2403. As with the socket and sheath members described in FIGS. 21-23, the socket 2403 is fastened to sheath 2501 via snap fastening.

Figure 26:
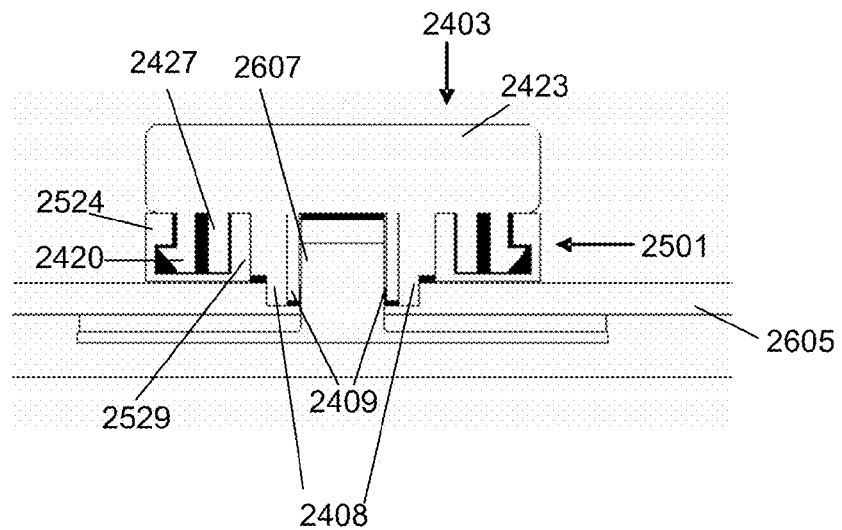
FIG. 26 is a cross-sectional view of an electrical connector assembly including a circularly keyed low profile sheath and a circularly keyed locked socket member in accordance with one embodiment of the present invention.

FIG. 26 is a cross-sectional view of an electrical connector assembly including a circularly keyed lockable low profile sheath 2501 and a stud assembly including conductive portion 2607 disposed on a photovoltaic module 2605. The shaded areas in FIG. 26 are included for clarity and are intended to show open spacing in the assembly. A circularly keyed lockable socket 2403 is engaged with the conductive stud assembly portion 2607 through stud engaging portion 2408 and is also engaged with the circularly keyed lockable low profile sheath 2501 through keyed portion 2427. As shown in FIG. 26, when the circularly keyed lockable low profile sheath 2501 and the circularly keyed lockable socket 2403 are engaged with one another, the circular ridge 2529 of the circularly keyed lockable low profile sheath 2501 fits between the keyed portion 2427 and the portion 2408 of the circularly keyed socket 2403. Also as shown in FIG. 26, rimmed locking portions 2420 of the circularly keyed lockable socket 2403 are engaged with the ridged lock accepting portions 2524 of circularly keyed lockable low profile sheath 2501. The engagement of the rimmed locking portions 2420 of the of the circularly keyed lockable socket 2403 with the ridged lock accepting portions 2524 of circularly keyed lockable low profile sheath 2501 provides a locking mechanism that renders removal of the circularly keyed lockable socket 2403 impossible or extremely difficult without the use of a removing tool.

Figure 27:
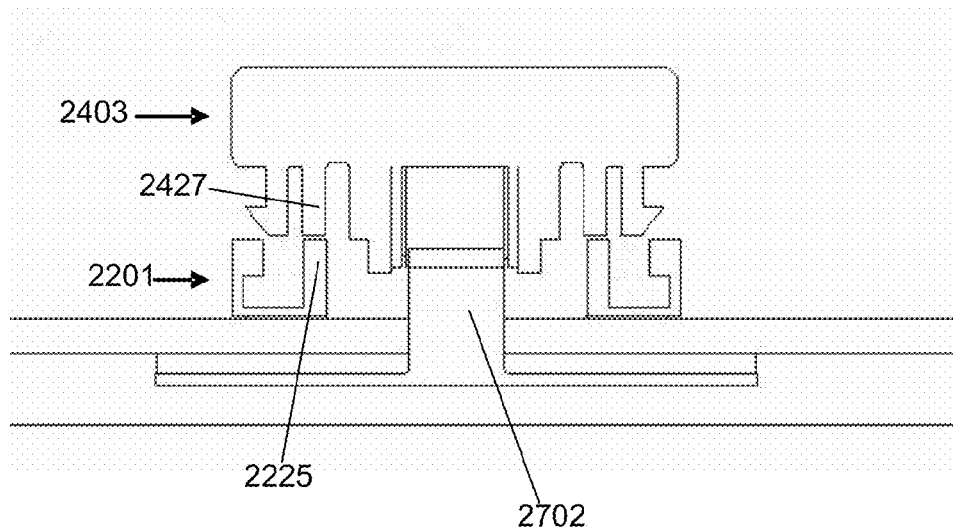
FIG. 27 is a cross-sectional view of a circularly keyed low profile sheath and a mismatched circularly keyed lockable socket disposed above the sheath.

The circularly keyed lockable sockets 2103 and 2403 (shown in FIGS. 21 and 24, respectively) and the circularly keyed low profile sheaths 2201 and 2501 (shown in FIGS. 22 and 25, respectively) are keyed such that mismatched pairings are not be able to engage with one another. FIG. 27 is a cross-sectional view of a circularly keyed lockable low profile sheath 2201 in accordance with that shown in FIG. 22 disposed on a photovoltaic module. A mismatched circularly keyed lockable socket 2403 in accordance with that shown in FIG. 24 is disposed above the sheath 2201. FIG. 27 illustrates that the keyed portion 2427 of the circularly keyed lockable socket 2403 collides with the circular ridge 2225 of the mismatched circularly keyed lockable low profile sheath 2201 if engagement of these two components is attempted, preventing the connection of the mismatched components. In certain embodiments, the conductive portions of socket 2403 and stud 2702 are preventing from contacting.

Figure 28:
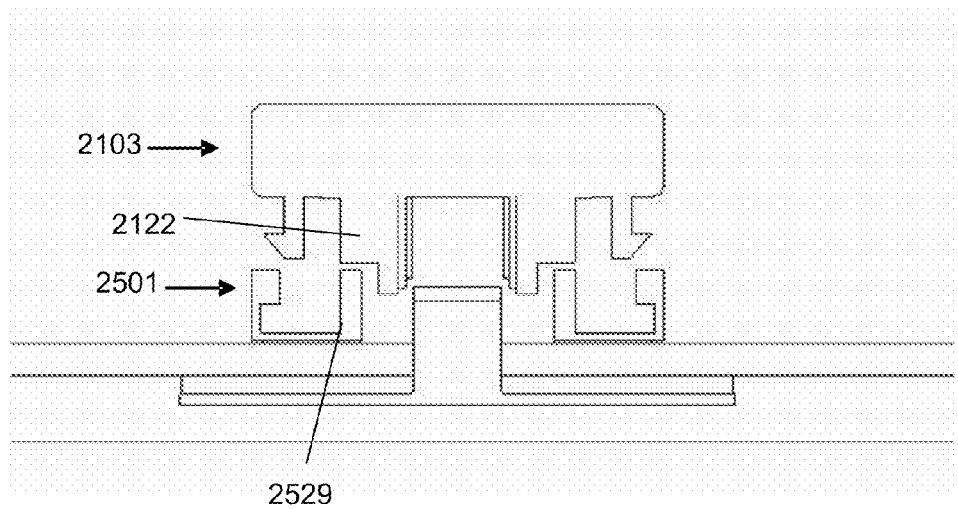
FIG. 28 is a cross-sectional view of a circularly keyed low profile sheath and a mismatched circularly keyed lockable socket disposed above the sheath.

Similarly, FIG. 28 is a cross-sectional view of a circularly keyed lockable low profile sheath 2501 in accordance with that shown in FIG. 25 disposed on a photovoltaic module. A mismatched circularly keyed lockable socket 2103 in accordance with that shown in FIG. 21 is disposed above the sheath 2501. FIG. 28 illustrates that the keyed portion 2122 of the circularly keyed lockable socket 2103 collides with the circular ridge 2529 of the mismatched circularly keyed lockable low profile sheath 2501, if engagement of these two components were attempted.

Figure 29:
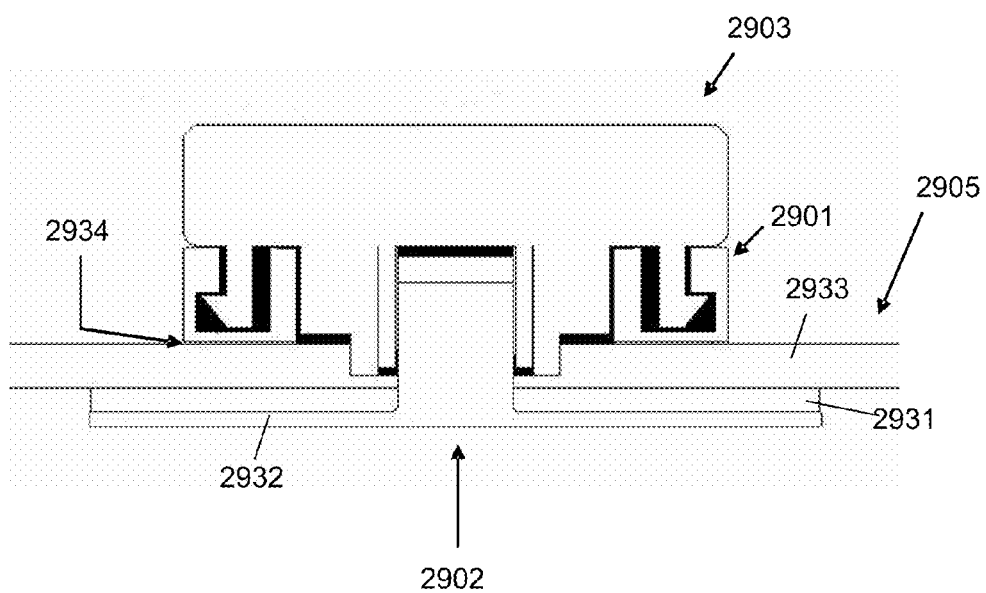
FIG. 29 is a cross-sectional view of a portion of a solar module and electrical connector assembly including an interior seal disposed between a conductive stud member and an encasing layer of the module.

Also provided are electrical connector assemblies that include a seal extending around a stud assembly in a module interior. In certain embodiments, the stud assembly includes a flange portion extending around the base of a conductive cylinder portion of the stud. A seal disposed between the flange and the module glass is formed by coating the flange with a sealant material. An example is shown in FIG. 29, which shows a cross-sectional view of an electrical connector assembly for a photovoltaic module 2905. A conductive stud assembly 2902 includes a base portion 2932 extending around the stud assembly 2902. A seal 31 is disposed between base portion 2932 and outer layer 2933 of the photovoltaic module 2905. While some weather-proofing is provided by a seal 2934 disposed between the circularly keyed lockable low profile sheath 2901 and the outer layer 2933 of the photovoltaic module 2905, the inclusion of a seal 2931 between the base portion 2932 of the conductive stud assembly 2902 and the outer layer 2933 of the photovoltaic module 2905 provides additional protection to internal portions of the photovoltaic module in adverse weather conditions. The seal may comprise a material that acts as a desiccant to prevent water from entering the interior of the module, for example a zeolite. Examples of seal materials that may be used include butyl rubber and silicone. The seal may also be relatively thick compared to the thickness if the base portion 2932 of the stud assembly 2902. Example thickness of the seal range from about 0.5 to 5 mm.

Although the foregoing invention has been described in some detail for purposes of clarity of understanding, it will be apparent that certain changes and modifications may be practiced within the scope of the invention. For example, while certain embodiments described above have circular studs, sockets and sheaths, other shapes may be used. In certain embodiments, a circularly keyed socket and sheath may be employed, with the base portions of either of those components shaped as desired. Also, in certain embodiments, the designs may be modified such that a socket member connects to any type of cable or other interconnect member for interconnection between modules. While various types of inter-engageable keyed and/or locking features have been described above, the invention is not so limited and may use any type of inter-engageble features as recognized in the art. The various conduction paths described may also be altered without departing from the scope of the invention. There are many alternative ways of implementing the apparatuses of the present invention. Accordingly, the present embodiments are to be considered as illustrative and not restrictive, and the invention is not to be limited to the details given herein.

What is claimed is:

1. A low-profile electrical connector assembly for a solar module, comprising:
    a conductive member comprising a conductive base portion and an axially-oriented cylindrical portion having first and second ends with a insulative portion at the second end and a conductive portion extending from the insulative portion to the first end;
    a toroidal sheath member positioned substantially co-axially about said cylindrical portion to surround at least the conductive portion thereof; and
    a socket member comprising a base portion and a hollow conductive cylindrical member extending from the base portion and configured to mate with a conductive portion of the conductive member, wherein
    said toroidal sheath member and said socket member comprise keyed inter-engageable features, further wherein
    the keyed features of one of the toroidal sheath member and the socket member comprise one or more rimmed locking portions, and the keyed features of the other of the toroidal sheath member and the socket member comprise one or more ridged lock accepting portions configured to engage the one or more rimmed locking portions.

2. The electrical connector assembly of claim 1 wherein the profile of the mated conductive toroidal sheath and socket member is no more than about 1.5 inches.

3. The electrical connector assembly of claim 1 wherein the cylindrical portion of the conductive member is no more than about 0.5 inches long.

4. The electrical connector assembly of claim 1 wherein the keyed inter-engageable features comprise a circular groove and a raised circular ridge configured to fit into said groove.

5. The electrical connector assembly of claim 1 wherein, when the keyed inter-engageable features of the toroidal sheath member and the socket member are engaged, the connector is locked.

6. The electrical connector assembly of claim 1 wherein the keyed inter-engageable features comprise at least one slot and at least one prong configured to fit into the at least one slot.

7. The electrical connector assembly of claim 1 wherein the conductive member extends through an outer layer of the module, and further comprising a seal on the interior of the module disposed between the conductive base portion of the conductive member and the outer layer.

8. The electrical connector assembly of claim 1 wherein the keyed features of the toroidal sheath member form a circle and wherein the keyed features of the socket member form a circle.

9. The electrical connector assembly of claim 8 wherein keyed features of the toroidal sheath member are engageable with the keyed features of the socket member in any rotational position of the socket member in a plane parallel to a surface of the solar module.

10. The electrical connector assembly of claim 1 wherein the keyed features of one of the toroidal sheath member and the socket member comprise one or more flexibly resilient members; further wherein the keyed features of the other of the toroidal sheath member and the socket member comprise substantially inflexible locking members configured to engage the flexibly resilient members.

11. The electrical connector assembly of claim 10 wherein the keyed inter-engageable features comprise an aperture for accepting a tool configured to unlock the connector.

12. The electrical connector assembly of claim 1 wherein said toroidal sheath member and said socket member comprise lockable inter-engageable features.

13. The electrical connector assembly of claim 12 wherein the lockable features of one of the toroidal sheath member and the socket member comprise one or more rimmed locking portions; further wherein the lockable features of the other of the toroidal sheath member and the socket member comprise one or more ridged lock accepting portions configured to engage the one or more rimmed locking portions members.

14. The electrical connector assembly of claim 12 wherein the lockable features of one of the toroidal sheath member and the socket member comprise one or more flexibly resilient members; further wherein the lockable features of the other of the toroidal sheath member and the socket member comprise substantially inflexible locking members configured to engage the flexibly resilient members.

15. An electrical connector assembly for a solar module, comprising:
- a conductive member comprising an axially-oriented cylindrical portion having first and second ends;
- a sheath member positioned about said cylindrical portion to surround at least the conductive portion thereof; and
- a socket member comprising a base portion, a conductive member engaging portion configured to mate with the cylindrical portion of the conductive member, wherein when
- the socket member is not engaged with the conductive member, the sheath member surrounds at least the conductive portion of the conductive member such that the electrical connector assembly is finger safe, further wherein
- the sheath member comprises:
- an outer wall, the outer wall comprising a front face, the front face comprising two opposing portions extending inward and sized to allow a connector to fit between the two opposing portions;
- a front face opening in the outer wall; and
- a ceiling portion having a ceiling opening, and further wherein
- the socket member comprises a vertical nubbin extending from a circular base portion.

16. The electrical connector assembly of claim 15 wherein the ceiling opening is in communication with front face opening.

17. The electrical connector assembly of claim 15 wherein the ceiling opening is defined by the ceiling portion and is not in communication with the front face opening.

18. The electrical connector assembly of claim 15 wherein the socket member comprises a base portion having a hollow cylindrical stud-receiving area formed therein.

19. The electrical connector assembly of claim 15 wherein the sheath member comprises a side wall having a rim and connected to a base, wherein the base comprises a base opening and wherein the diameter of the portion of the side wall that connects to the base is larger than the diameter of the rim.

20. The electrical connector assembly of claim 15 wherein the cylindrical portion of the conductive member is flared at one end.

21. A solar module comprising:
- first and second encasing layers;
- a plurality of interconnected solar cells disposed between the first and second encasing layers;
- a first external connector assembly comprising a first stud member extending through an encasing layer and electrically connected to the plurality of interconnected solar cells and a first keyed sheath member disposed on the encasing layer and surrounding at least a conductive portion of the first stud member, wherein said first keyed sheath member is configured to mate with a first keyed socket member; and
- a second external connector assembly comprising a second stud member extending through an encasing layer and electrically connected to the plurality of interconnected solar cells and a second keyed sheath member disposed on the encasing layer and surrounding at least a conductive portion of the second stud member, wherein said second keyed sheath member is configured to mate with a second keyed socket member; wherein the first keyed sheath member is configured such that it cannot mate with the second keyed socket member, and further wherein the second keyed sheath member is configured such that it cannot mate with the first keyed socket member.

* * * * *